United States Patent
Kang et al.

(10) Patent No.: US 7,612,613 B2
(45) Date of Patent: Nov. 3, 2009

(54) SELF REGULATING BIASING CIRCUIT

(75) Inventors: Li-Hung Kang, Gilbert, AZ (US); Chong W Choi, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 12/026,394

(22) Filed: Feb. 5, 2008

(65) Prior Publication Data
US 2009/0195318 A1   Aug. 6, 2009

(51) Int. Cl.
    H03F 3/04   (2006.01)
(52) U.S. Cl. .......................... 330/296; 330/285
(58) Field of Classification Search ............. 330/285, 330/296
    See application file for complete search history.

(56) References Cited

U.S. PATENT DOCUMENTS

| | | | |
|---|---|---|---|
| 4,491,691 A | 1/1985 | Embree et al. | |
| 4,567,333 A | 1/1986 | Embree et al. | |
| 4,827,222 A | 5/1989 | Hester et al. | |
| 4,959,618 A | 9/1990 | Shier | |
| 5,349,286 A | 9/1994 | Marshall et al. | |
| 5,532,616 A | 7/1996 | Keeney | |
| 5,592,123 A | 1/1997 | Ulbrich | |
| 5,684,394 A | 11/1997 | Marshall | |
| 5,986,501 A | 11/1999 | Rafati et al. | |
| 6,002,243 A | 12/1999 | Marshall | |
| 6,023,185 A | 2/2000 | Galipeau et al. | |
| 6,259,238 B1 | 7/2001 | Hastings | |
| 6,339,319 B1 | 1/2002 | Clapp, III | |
| 6,496,317 B2 | 12/2002 | Lacombe | |
| 6,717,463 B2 | 4/2004 | Aparin et al. | |
| 6,914,475 B2 | 7/2005 | Enriquez et al. | |
| 6,946,911 B2 * | 9/2005 | Yang et al. .................. 330/296 |
| 6,972,624 B1 | 12/2005 | Stroet | |
| 6,980,052 B1 | 12/2005 | Stroet | |
| 7,088,179 B2 | 8/2006 | Gilbert et al. | |
| 7,109,800 B2 * | 9/2006 | Noh et al. .................... 330/296 |
| 7,262,657 B2 | 8/2007 | Nellis et al. | |
| 7,352,231 B2 | 4/2008 | Hastings | |
| 7,466,202 B2 | 12/2008 | Karthaus et al. | |

(Continued)

OTHER PUBLICATIONS

Gray, Paul R., Hurst, Paul J., Lewis, Stephen H., Meyer, Robert G., Chapter 4, Section 4.2.3 Simple Current Mirror with Beta Helper, Analysis and Design of Analog Integrated Circuits, 4th ed., 2001, pp. 260-262, John Wiley & Sons, New York.

*Primary Examiner*—Khanh V Nguyen
(74) *Attorney, Agent, or Firm*—Jackson Walker L.L.P.

(57) ABSTRACT

A disclosed self regulating biasing circuit (SRBC) includes an unregulated node that couples to an unregulated power supply that produces a supply voltage. An impedance element of the SRBC carries an unregulated current having a nominal component and a variance component between an unregulated node and a regulated node. A detection circuit connected between the unregulated node and a third node detects a variance component of a supply voltage and generates a detection current based on the variance component. A compensation circuit connected to the third node draws a compensation current, based on the detection current, from the regulated node. The SRBC is designed wherein the compensation current is approximately equal to the variance component of the unregulated current. The regulated node may be connected to a control terminal of a transistor to be biased.

10 Claims, 4 Drawing Sheets

U.S. PATENT DOCUMENTS

| | | |
|---|---|---|
| 7,495,511 B2 | 2/2009 | Gilbert et al. |
| 7,514,989 B1 | 4/2009 | Somerville et al. |
| 2001/0022700 A1 | 9/2001 | Lacombe |
| 2002/0067205 A1 | 6/2002 | Aparin et al. |
| 2002/0146993 A1 | 10/2002 | Persico et al. |
| 2003/0222706 A1 | 12/2003 | Enriquez et al. |
| 2005/0007177 A1 | 1/2005 | Hastings |
| 2005/0057304 A1 | 3/2005 | Gilbert et al. |
| 2006/0001475 A1 | 1/2006 | Price, Jr. |
| 2006/0208796 A1 | 9/2006 | Nellis et al. |
| 2006/0238254 A1 | 10/2006 | Gilbert et al. |
| 2006/0255838 A1 | 11/2006 | Bergmann |
| 2007/0046603 A1 | 3/2007 | Smith et al. |
| 2007/0069992 A1 | 3/2007 | Smith et al. |
| 2007/0085779 A1 | 4/2007 | Smith et al. |
| 2007/0222519 A1 | 9/2007 | Deng et al. |
| 2007/0285171 A1 | 12/2007 | Karthaus et al. |
| 2007/0290757 A1 | 12/2007 | Gilbert et al. |
| 2008/0048634 A1 | 2/2008 | Kotchkine et al. |
| 2008/0100382 A1 | 5/2008 | Fisher et al. |
| 2008/0303756 A1 | 12/2008 | Smith |
| 2009/0140797 A1 | 6/2009 | Kuehlwein et al. |

* cited by examiner

US 7,612,613 B2

SELF REGULATING BIASING CIRCUIT

BACKGROUND

1. Field

The disclosed subject matter is in the field of power amplifiers and, more particularly, power amplifier biasing circuits.

2. Related Art

Power amplifiers are commonly used in radio frequency (RF) circuits. Power amplifiers may employ power supplies that are either regulated or unregulated. The regulation circuitry in regulated power supplies increases the cost of regulated power supplies. Power amplifiers that rely on unregulated power supplies, on the other hand, are generally more susceptible to variations in the supplied power.

BRIEF DESCRIPTION OF THE DRAWINGS

The present invention is illustrated by way of example and is not limited by the accompanying figures, in which like reference numerals indicate similar elements. Elements in the figures are illustrated for simplicity and clarity and have not necessarily been drawn to scale.

DETAILED DESCRIPTION

Figure 1:
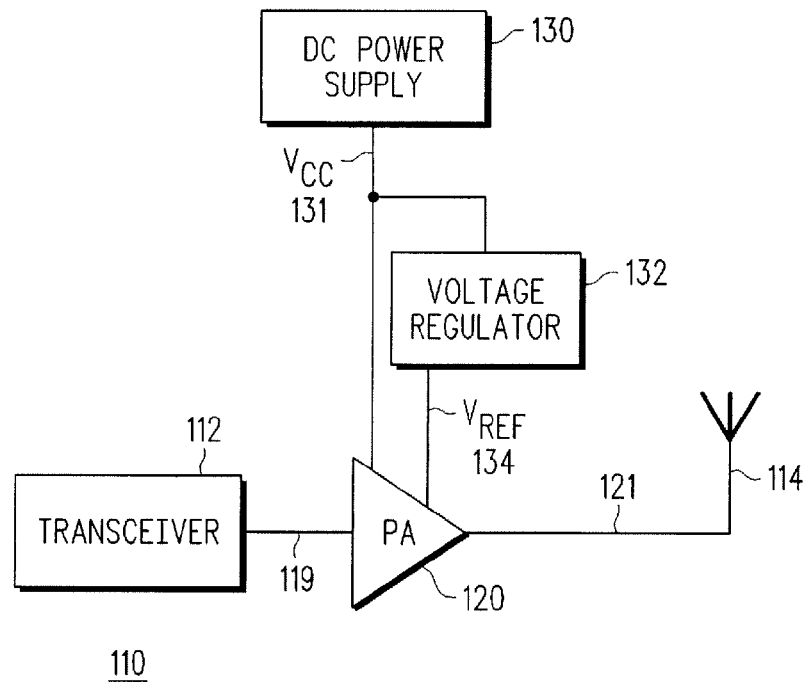
FIG. 1 is a block diagram of selected elements of an embodiment of a radio frequency circuit including a power amplifier.

Referring to FIG. 1, a block diagram of selected elements of an embodiment of an RF circuit 110 is shown. RF circuit 100 as depicted in FIG. 1 includes a transceiver 112, a power amplifier (PA) 120, and an antenna 114. Transceiver 112 provides an RF input signal 119 to PA 120. PA 120 produces an RF output signal 121 that is applied to antenna 114 for wireless transmission.

RF circuit 100 as depicted in FIG. 1 includes a DC power supply 130 and a voltage regulator 132. DC power supply 130 may be a battery or an AC adapter plugged into a conventional 120V socket or connected to another source of AC power (not depicted). DC power supply 130 produces an unregulated DC voltage signal identified in FIG. 1 as VCC 131. In some cases, VCC 131, as an unregulated signal, may vary over time by 10% or more from its nominal value. Voltage regulator 132 receives VCC 131 and generates a regulated reference voltage signal identified in FIG. 1 as VREF 134. VCC 131 and VREF 134 are provided to PA 120 and, more specifically, to a biasing circuit of PA 120, an example of which is depicted in FIG. 2.

Figure 2:
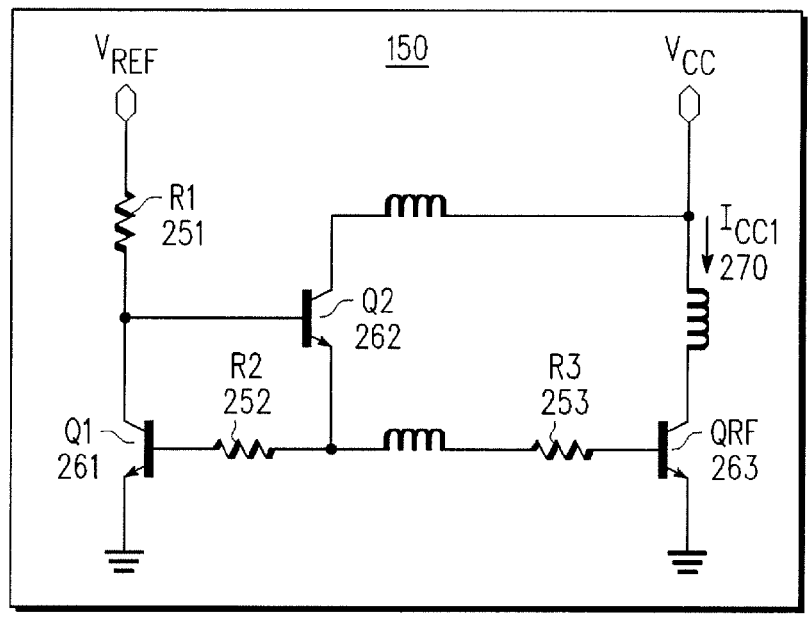
FIG. 2 is a circuit diagram of selected elements of an embodiment of a biasing circuit for use with a power amplifier.

Referring to FIG. 2, a block diagram illustrating selected elements of an embodiment of a biasing circuit 150 suitable for use in PA 120 of FIG. 1 is presented. In the depicted embodiment, biasing circuit 150 receives VCC 131 and VREF 134 and provides the biasing or quiescent state for an RF power transistor QRF 263. In some embodiments QRF 263 represents the input stage to PA 120 of FIG. 1. In the depicted embodiment of biasing circuit 150, the base currents of Q1 261 and QRF 263 are determined by the emitter current of Q2 262 and the values of R2 252 and R3 253. The emitter current of Q2 262 is determined by base current of Q2 262 and the DC current gain ($\beta$) of Q2 262. Thus, the base current of Q2 262 determines the base current of Q1 261 and QRF 263. Through appropriate selection of values for VREF 134, R1 251, R2 252, R3 253, Q1 261 and Q2 262, biasing circuit 150 can be designed to achieve a desired base current for QRF 263 and, therefore, a desired collector current, identified as ICC1 270, for QRF 263.

Biasing circuit 150 as depicted in FIG. 2 relies on the receipt of the regulated voltage signal, VREF 134. In the absence of a regulated voltage, ICC1 270 would exhibit a relatively strong dependence on VCC 131. An exemplary graph of ICC1 as a function of VCC is illustrated as plot 701 in FIG. 7 for the case where voltage regulator 132 is absent. Plot 701 reveals that ICC1 is a strong function of VCC. For example, a decrease in VCC from 4.0 to 3.5 V results in a decrease of ICC1 from approximately 72 mA to approximately 60 mA, a percentage decrease that exceeds 16%. Similarly, an increase in VCC from 4.0V to 4.5V produces an increase in ICC1 from 72 to 80 mA, an increase of more than 11%. It is highly undesirable if the quiescent conditions for the RF power transistor vary substantially. Regulated voltages, however, are not available in some applications and are difficult and/or relatively expensive to achieve in other applications.

Figure 3:
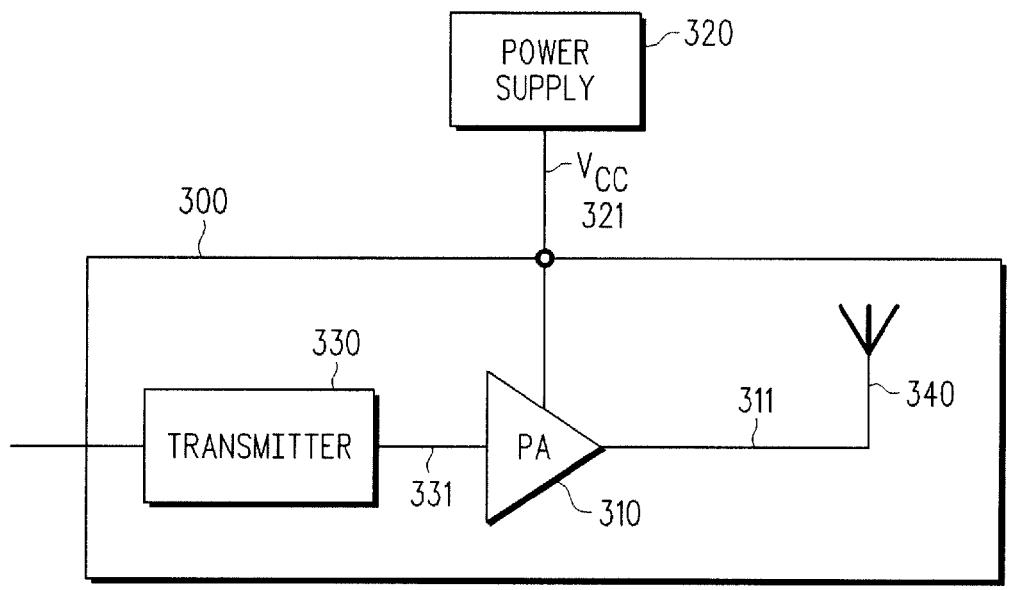
FIG. 3 is a block diagram of selected elements of another embodiment of a radio frequency circuit including a power amplifier.

FIG. 3 depicts selected elements of an embodiment of a radio frequency (RF) circuit 300 employing a self regulating biasing circuit as described herein. In the depicted embodiment, RF circuit 300 includes a transmitter 330 that generates an RF input signal 331. RF input signal 331 is provided to power amplifier (PA) 310. PA 310 generates an RF output signal 311 that is applied to an antenna 340 for transmission.

PA 310 as shown in FIG. 3 is operable to connect to a power supply 320 that generates a supply signal including a supply signal voltage identified as VCC 321. In some embodiments, power supply 320 is a DC voltage supply, such as a battery-based voltage supply that includes one or more batteries. In these embodiments, VCC 321 is a DC voltage signal. Although the illustrated embodiment of power supply 320 is described herein as being a DC voltage supply, power supply 320 may be an AC supply and/or be a current supply. In some embodiments, power supply 320 may include an AC adapter operable to convert a source of AC power to a DC supply signal using a conventional switch-mode or linear regulator.

VCC 321 may be described herein as an unregulated signal to emphasize the lack of a conventional voltage regulator in RF circuit 300 and to emphasize further that VCC 321 includes a nominal component and a time-varying component, sometimes referred to herein as a variance component, that may be significant. In the case of a DC power supply 320, the nominal component of VCC 321 has a constant value. In some cases, the variance component of VCC 321 may have a magnitude that is 15% or more of the nominal component.

Figure 4:
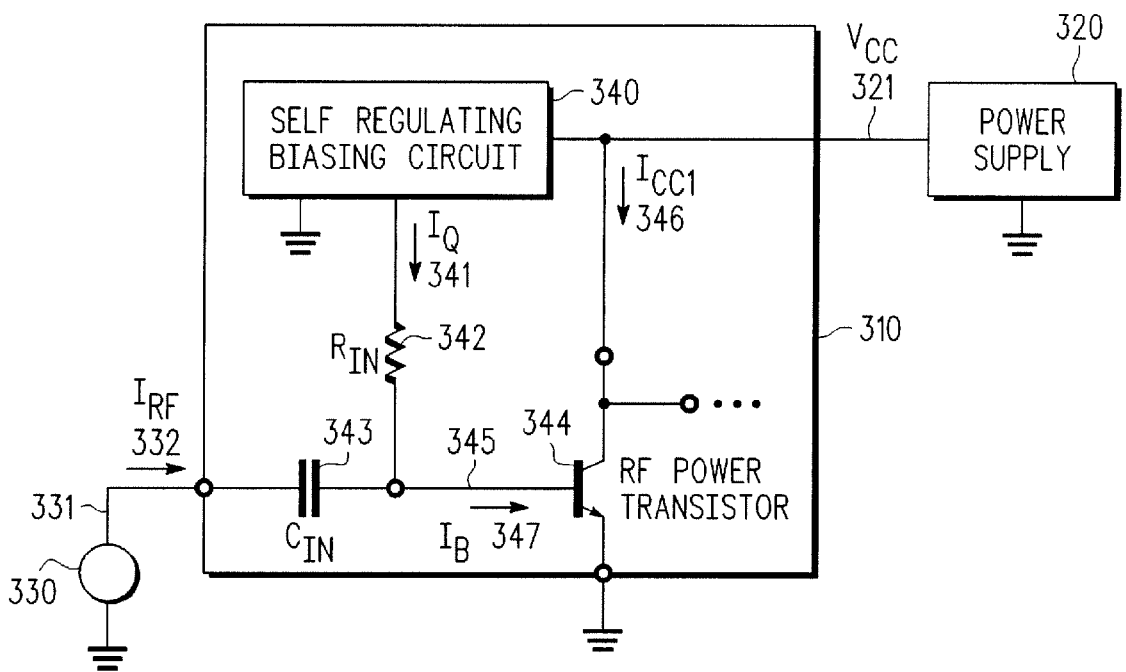
FIG. 4 is a diagram of selected elements of an embodiment of a power amplifier including a self regulating biasing circuit.

Turning now to FIG. 4, a diagram illustrating selected elements of an embodiment of PA 310 is presented. The depicted embodiment of PA 310 includes a self regulating biasing circuit (SRBC) 340, an RF power transistor 344, an input resistor (RIN) 342, and an input capacitor (CIN) 343. CIN 343 couples RF input signal 331 generated by transmitter 330 to a control terminal 345 of RF power transistor 344.

As depicted in FIG. 4, RF input signal 331 is a current signal identified as IRF 332. Because CIN 343 is an open circuit under DC conditions, IRF 332 and CIN 343 can be ignored for purposes of discussing quiescent conditions for PA 310.

Input resistor RIN 342 is connected between SRBC 340 and control terminal 345 of RF power transistor 344. RF power transistor 344 is the transistor for which the quiescent biasing conditions are to be established. As such, RF power transistor 344 is sometimes referred to herein as the biased transistor. Depending upon the context, input resistor RIN 342 may be described as being a part of SRBC 340 or as part of the circuit-to-be-biased, which includes RF power transistor 344. RF power transistor 344 may server as the input stage of the PA 310.

In the depicted embodiment, SRBC 340 determines the quiescent condition for RF power transistor 310. As shown in FIG. 4, for example, SRBC 340 produces a current, identified as IQ 341, that is provided, via RIN 342, to control terminal 345 of RF power transistor 344. Ignoring the input current IRF 332, the collector current of RF power transistor 344, identified as ICC1 346 is a strong function of IQ 341. SRBC 340 is operable to maintain relatively stable quiescent conditions for the biased transistor 344 despite potentially wide variations of VCC 321.

In embodiments that employ a type of bipolar RF power transistor 344, the quiescent conditions may include IQ 341, which represents the base current for RF power transistor 344 and ICC1 346, the collector current for RF power transistor 344. Assuming that power supply 320 is able to produce a value of VCC 321 that is sufficiently high to maintain RF power transistor 344 in saturation, IQ 341 will remain relatively stable across a relatively wide range of values for VCC 321. By maintaining a relatively stable value for IQ 341 and ICC1 346, in some embodiments, SRBC 340 may regulate IQ 341 sufficiently to maintain ICC1 346 within approximately 3.5% of its nominal value.

During normal operation, IQ 341 is combined with the IRF 332 generated by transmitter 330 to form a base current IB 347 for RF Power transistor 344. For quiescent state analysis IB 347 is equal to IQ 341 and IB 347 will not be referred to herein. RF power transistor 344 may be implemented as a relatively large npn transistor suitable for generating sufficient current to drive one or more subsequent power amplifier stages (not depicted). In other embodiments, RF power transistor 344 may be a pnp transistor or a p-type or n-type metal oxide semiconductor (MOS) transistor.

ICC1 346 represents the steady-state collector current of RF power transistor 344. In some embodiments, SRBC 340 ensures a stable value of ICC1 346 by regulating IQ 341, which is provided to control terminal 345 of RF power transistor 344. SRBC 340 is operable to reduce or eliminate dependence of IQ 341 on VCC 321. In some embodiments, for example a ratio of $\Delta IQ$ to $\Delta VCC$ is less than approximately 10%, where $\Delta IQ$ represents a percentage change in IQ 341 and $\Delta VCC$ represents a percentage change in VCC. Because of the very strong dependence between IQ 341 and ICC1 346, SRBC 340 reduces the dependence of ICC1 346 on VCC 321.

Figure 5:
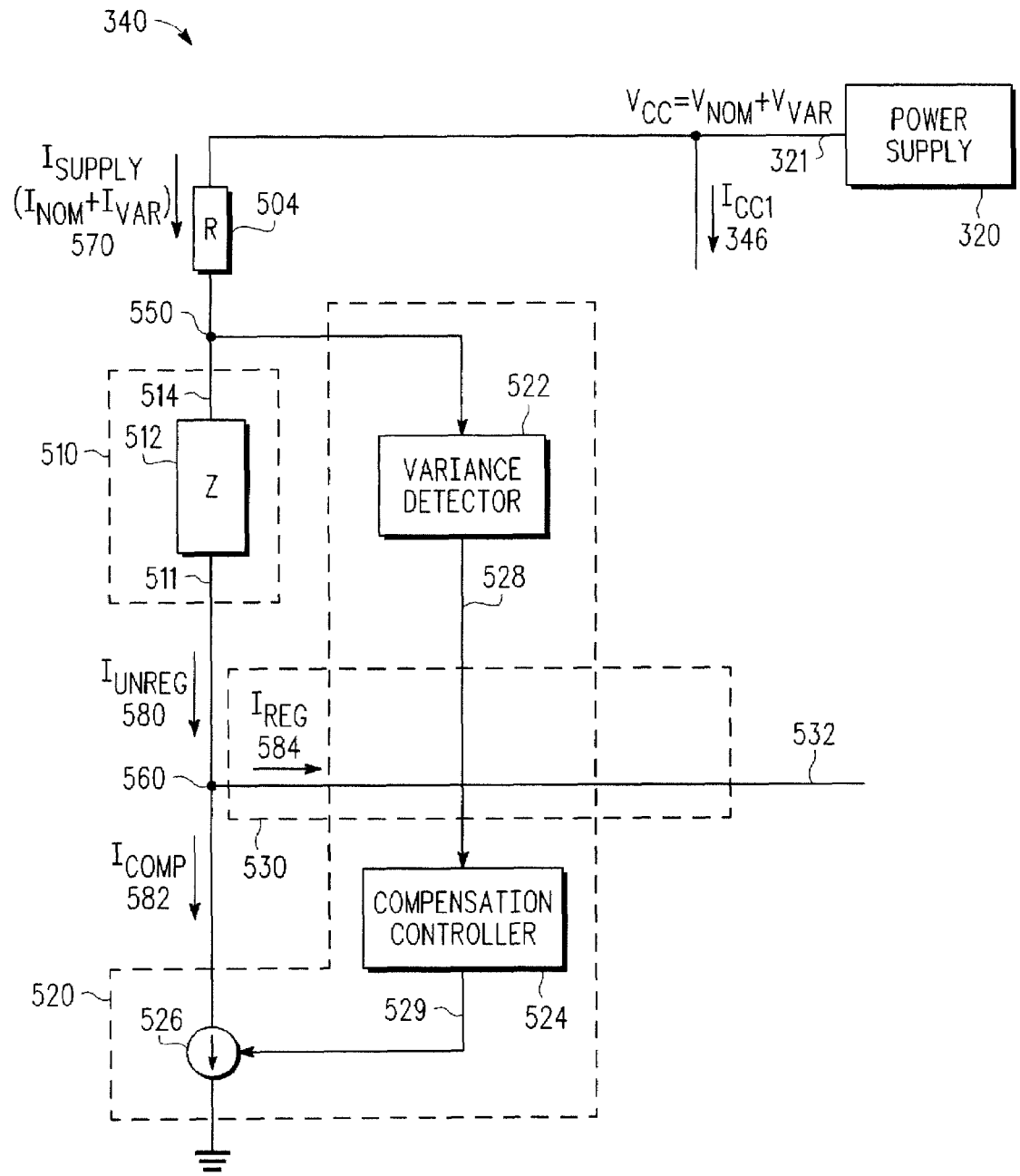
FIG. 5 is a diagram of selected elements of an embodiment of a self regulating biasing circuit.

Referring now to FIG. 5, a block diagram illustrating selected portions of an embodiment of SRBC 340 is presented. As depicted in FIG. 5, SRBC 340 receives an unregulated VCC 321 and produces a regulated signal identified as IREG 584. IREG 584 is used to generate a base current for a biased transistor. Depending upon the implementation of the circuit to be biased, IREG 584 may be a current signal or a voltage signal. When implemented for use in the PA 310 of FIG. 4, IREG 584 determines the current, IQ 341, provided to the control terminal of RF power transistor 344.

SRBC 340 as depicted in FIG. 5 receives VCC 321 from power supply 320. VCC 321 is an unregulated signal that includes a nominal component VNOM and a variance component VVAR. Power supply 320 also provides a supply current ISUPPLY 570 as shown that also includes a nominal component INOM and a variance component IVAR.

SRBC 340 as shown includes a first subcircuit 510, a second subcircuit 520, and a third subcircuit 530. First subcircuit 510 as shown carries an unregulated current (IUNREG) 580 from unregulated node 550 to a regulated node 560. IUNREG 580 is a strong function of ISUPPLY 580.

Second subcircuit 520 is configured to monitor or detect a voltage or current of unregulated node 550 and thereby monitor or detect a variance component VVAR of VCC 321. Based on the monitored or detected value of VVAR, second subcircuit 520 as shown is designed to draw a current, referred to herein as compensation current (ICOMP) 582 from regulated node 560. In some embodiments, SRBC 340 is designed so that ICOMP 582 is approximately equal to and offsets the variance component of IUNREG 580. In these embodiments, third subcircuit 530, which carries IREG 584, is constrained by Kirchoff's current law to approximate the nominal component of IUNREG 584. Specifically, with first subcircuit 510 carrying an IUNREG 580, having a nominal component and a variance component, to regulated node 560 and second subcircuit 520 drawing ICOMP 582, approximately equal to the variance component of IUNREG 580 from regulated node 560, the current drawn away from regulated node 560, i.e., IREG 584, is maintained at a value that is approximately equal to the nominal component of IUNREG 580. By maintaining IREG 584 free or approximately free of a variance component, SRBC 340 provides a quiescent state that is relatively immune to variations in supply voltage while, at the same time, eliminating the need for an external voltage regulator.

As shown in FIG. 5, the depicted embodiment of first subcircuit 510 is implemented as an impedance network 512. Impedance network 512 as shown is a two terminal impedance network that includes a first terminal 514 connected to unregulated node 550 and a second terminal 516 connected to regulated node 560. Impedance network 512 may include zero or more resistive, capacitive, and/or inductive elements connected in various configurations. Impedance network 512 conveys variations in voltage and/or current at unregulated node 550 to regulated node 560. In some embodiments including an embodiment depicted in FIG. 5, impedance network 512 may include just a single resistor.

Second subcircuit 520 as shown in FIG. 5 includes a variance detector 522 connected to unregulated node 550 and a compensation controller 524 that controls a current source 526. Current source 526 may be implemented as a voltage controlled current source that draws ICOMP 582 from regulated node 560. Variance detector 522 produces a signal 528 indicative of a variance component at unregulated node 550. In the depicted embodiment, compensation controller 524 controls current source 526 to control the current drawn from regulated node 560. In some embodiments including the embodiment depicted in FIG. 5, compensation controller 524 and current source 526 are integrated and implemented as a bipolar transistor with a β value of 10 or more.

Third subcircuit 530 as shown is implemented as a simple conductor 532 arranged to convey IREG 584 from regulated node 560 to a control terminal of the biased transistor or to a circuit that drives the current provided to the control terminal of the biased transistor.

Variations of the voltage and/or current at unregulated node 550 cause changes in IUNREG 580. Second subcircuit 520 is operable to effect a change in ICOMP 582 that largely negates changes in IUNREG 580 and thereby results in an IREG 584 that is largely unaffected by voltage/current state changes at unregulated node 550.

Figure 6:
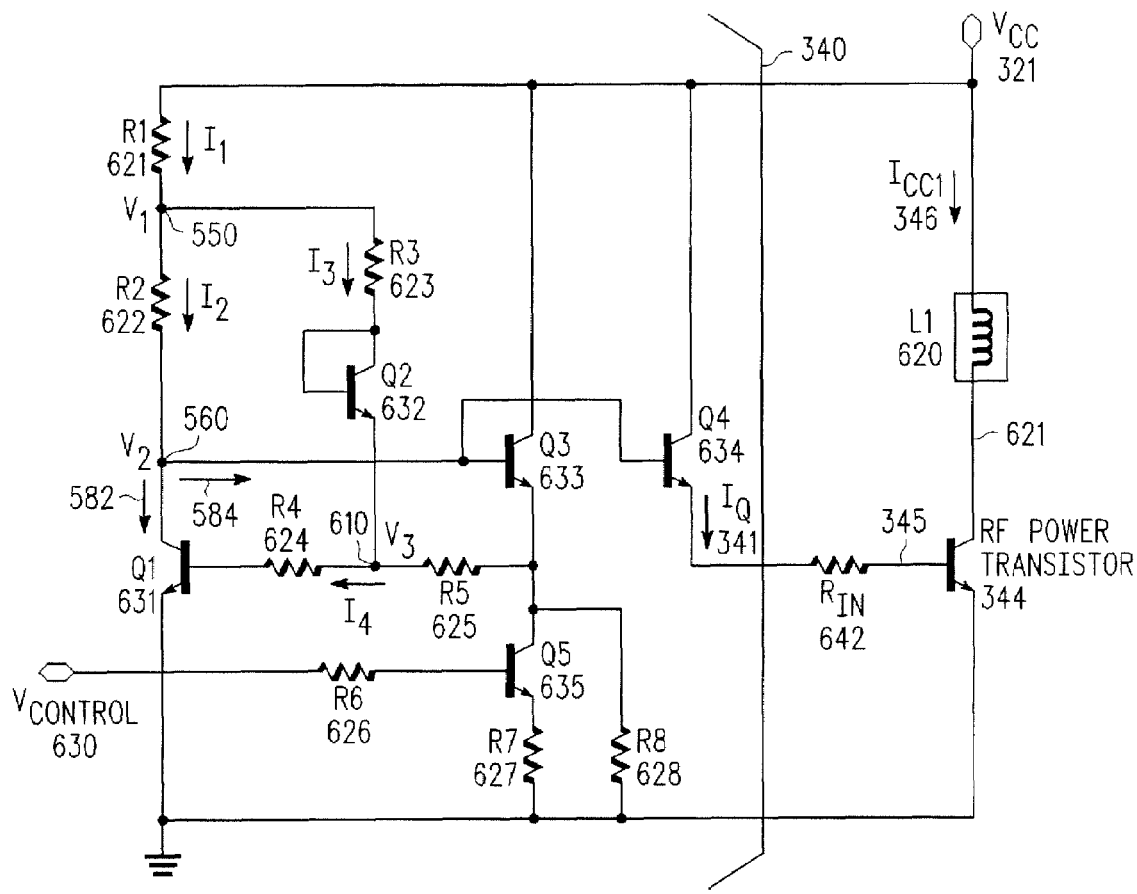
FIG. 6 is another diagram of selected elements of an embodiment of a self regulating biasing circuit.

Referring to FIG. 6, selected circuit elements of an implementation of an SRBC 340 suitable for producing a self regulated quiescent current IQ 341 and obtaining a regulated steady state value of ICC1 346 are shown. Although SRBC 340 as shown in FIG. 6 is implemented entirely with npn bipolar transistors, other embodiments may use or include pnp transistors and/or n-channel and/or p-channel MOS transistors. To emphasize the potential use of different types of transistors in different embodiments, the term "current terminal(s)" is used to refer to the collector and emitter terminals of a bipolar transistor and to the source and drain terminals of a MOS transistor. Similarly, the term "control terminal" may refer to the base terminal of a bipolar transistor and the gate electrode of a MOS transistor. In addition, the current through or voltage across a two-terminal device, e.g., resistor R2, may be referred to herein as the R2 current and the R2 voltage respectively.

SRBC 340 implemented as shown in FIG. 6 includes eight resistors, R1 621 through R8 628, and five npn transistors, Q1 631 through Q5 635. In addition, SRBC 340 as shown includes a choke inductor L1 620 connected between VCC 321 and a current terminal, specifically, the collector terminal 621, of RF power transistor 344. Because the DC impedance of choke inductor L1 620 is zero, choke inductor L1 620 decouples the VCC 321 from the RF input signal, which is not shown in FIG. 6. FIG. 6 also depicts RF power transistor 344 and a resistor, referred to as input resistor 342, connected to control terminal 345 of RF power transistor 344. RF power transistor 344 may serve as a first stage in PA 310 of FIG. 3 and FIG. 4.

Comparing FIG. 5 to FIG. 6, the impedance network 512 of FIG. 5 is implemented in FIG. 6 with the single resistor R2 622. Variance detector 522 of FIG. 5 is implemented in FIG. 6 with the resistor R3 623 and transistor Q2 632 configured with its base terminal connected to its collector terminal. Compensation controller 524 and current source 526 of FIG. 5 are implemented in FIG. 6 with resistor R4 624 and compensation transistor Q1 631. Thus, the R2 current of FIG. 6 (I2) represents IUNREG 580 in FIG. 5 and the Q1 collector current in FIG. 6 represents ICOMP 582 in FIG. 6. FIG. 6 includes circuit elements that are not represented in FIG. 5. For example, SRBC 340 as shown in FIG. 6 includes quiescent adjustment circuit elements including adjustment transistor Q5 635 and its associated resistors as described in more detail below.

As depicted in FIG. 6, SRBC 340 regulates by maintaining IREG 384 at or near a nominal value as VCC 321 drifts or otherwise departs from its nominal value. A relatively stable IREG 384 results in a relatively stable IQ 341, which in turn produces a relatively stable ICC1 346. Under nominal steady state conditions, Q1 631 is biased to a nominal state characterized by a nominal base current. The Q1 collector current is predominantly determined by the Q1 base current and by Q1's β value. Using Kirchoff's current law at node 560, the R2 current (I2) is composed of ICOM 582 and IREG 584, that provides the base currents for Q3 633 and Q4 634. Thus, if biasing conditions change to produce an increase in ICOMP 582, the increase must be supplied by an increase in the R2 current and, if that is not sufficient, by a decrease in IREG 584.

When VCC 321 increases from its nominal value, the R1 current (I1) increases. Using Kirchoff's current law at node 550, an increase in I1 results in an increase in I2, an increase in R3 current (I3), or both. Increases in I3 have an amplified effect on ICOMP 582 because the I3 determines the base current (I4) for Q1 631. Increases in I2, on the other hand, produce a fractional increase in ICOMP 582, i.e., an increase that is less than unity.

In some embodiments, self regulation is achieved by implementing SRBC 340 wherein an increase in I1 produces an increase in I2 that is closely matched by an increase in ICOMP 582. If an increase in I2 is closely matched by an increase in ICOMP 582, a current analysis of node 560 dictates that IREG 584 remains relatively stable. In this manner, variations in the VCC 321 do not substantially alter the quiescent current IQ 341 that is provided to RF power transistor 344.

To design SRBC 340, Ohm's law may be used to describe the voltage/current relationship for R1 621, R2 622, R3 623, and R4 624.

$$R1*I1=VCC-V1 \qquad [Eq. 1]$$

$$R2*I2=V1-V2 \qquad [Eq. 2]$$

$$R3*I3=V1-V3-1.25 \text{ (where 1.25 is an approximate} \\ \text{value of the turn on voltage for Q2 632, in other} \\ \text{embodiments, the turn on voltage may be 0.7 V)} \qquad [Eq. 3]$$

$$K*R4*I3=V3-2.50 \text{ (where K is a number between 0} \\ \text{and 1 that reflects the fraction of I3 that flows} \\ \text{through R4 to Q1 631).} \qquad [Eq. 4]$$

Kirchoff's current law can be used on node 550 and node 610 respectively to yield:

$$I1=I2+I3 \qquad [Eq. 5]$$

$$I2=IREG+ICOMP \qquad [Eq. 6]$$

where ICOMP is the collector current of transistor Q1 631.

Using Eq. 6 to substitute for I2 in Eq. 5, substituting β*K*I3 for ICOMP, and rearranging for IREG yields:

$$IREG=I1-I3+\beta*K*I3 \text{ or} \qquad [Eq. 7]$$

$$IREG=I1-(1-\beta*K)*I3 \qquad [Eq. 8]$$

To be self-regulating, SRBC 340 should exhibit the property that ΔIREG/ΔVcc approximates 0. Differentiating Eq. 8 with respect to VCC produces:

$$\Delta IREG/\Delta Vcc=\Delta I1/\Delta Vcc-(1-\beta*K)\Delta I3/\Delta Vcc \qquad [Eq. 9]$$

Setting ΔIREG/ΔVcc to 0 produces:

$$\Delta I1/\Delta Vcc=(1-\beta*K)\Delta I3/\Delta Vcc \qquad [Eq. 10]$$

To solve Eq. 10 and thereby obtain an expression for the conditions desirable for achieving regulation, ΔI1/ΔVcc may be expressed in terms of ΔI3/ΔVcc. This can be done by differentiating Eq. 3 with respect to VCC 321 to obtain an expression of ΔI3/ΔVcc in terms of ΔV1/ΔVcc and ΔV3/ΔVcc. Differentiating Eq. 4 obtains an expression of ΔV3/ΔVcc in terms of ΔI3/ΔVcc that can be substituted into differentiated Eq. 3 to obtain an expression of ΔV1/ΔVcc in terms of ΔI3/ΔVcc. Eq. 1 may then be differentiated to obtain an expression of ΔI1/ΔVcc in terms of ΔV1/ΔVcc. Differentiated Eq. 1 and differentiated Eq. 3 may then be combined to obtain an expression of ΔI1/ΔVcc in terms of ΔI3/ΔVcc. This expression replaces the left hand side of Eq. 10, which is then solved:

$$(R3+K*R4)=(1-\beta*K). \qquad [Eq. 11]$$

When Eq. 11 is true, the corresponding SRBC 340 achieves self regulation as described.

In one implementation, suitable values for the elements of SRBC 340 include: R1 2.3 KΩ, R2 200Ω, R3 1 KΩ, R4 100Ω, R5 500Ω, R6 8.5 KΩ, R7 1.7 KΩ, and R8 10 KΩ. In this implementation, suitable values for the areas of transistors 631 through 635 include Q1—120 μm², Q2—5 μm², Q3—5 μm², Q4 160 μm², Q5—5 μm², and QRF—5760 μm². β values for all transistors 631 through 635 are in excess of 10 in some embodiments and in excess of 100 in some other embodiments.

Figure 7:
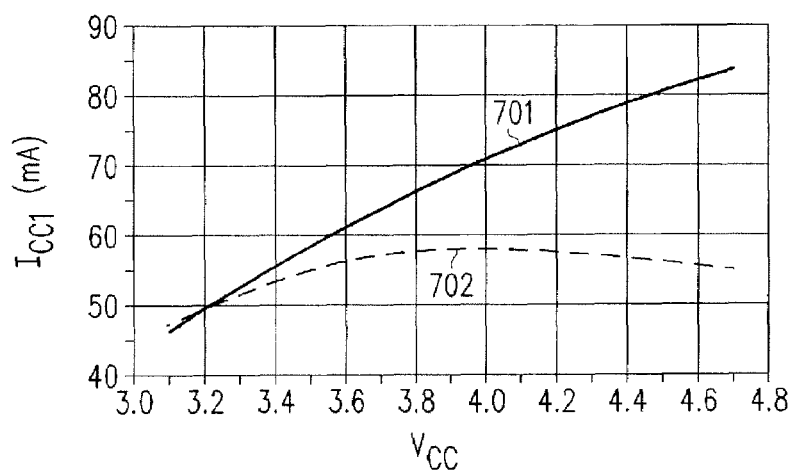
FIG. 7 is a graphical representation illustrating collector current for a power transistor in a power amplifier as a function of the supply voltage using two different biasing circuits.

Referring to FIG. 7, a graph 702 of an exemplary plot of the steady state power transistor collector current (ICC1 346) as a function of VCC 321 is shown for SRBC 340. As seen in FIG. 6, ICC1 346 varies by less than approximately 6 mA as VCC is varied from 3.4 V to 4.6 V. In contrast, the conventional biasing circuit exhibits a change in ICC1 346 of greater than 120 mA over the same voltage swing. The ability to maintain ICC1 346 without the use of a voltage regulator is a highly desirable feature of PA 310.

Referring back to FIG. 6, the depicted embodiment of SRBC 340 includes quiescent adjustment circuit elements operable to tune IQ 341 of RF power transistor 344. As implemented in FIG. 6, a control voltage VCONTROL 630 is provided to SRBC 340. In some embodiments, VCONTROL 630 is an externally supplied and adjustable voltage having a value that is independent of the supply voltage VCC. In other embodiments, VCONTROL 630 may be generated from VCC 321 using a conventional regulator or other circuitry.

Some embodiments of the quiescent adjustment control circuitry are designed for use with values of VCONTROL 630 in the range of approximately 1 V to 2.5 V. In this range, between the cut in voltage for adjustment transistor Q5 635 and saturation, the collector current of transistor Q5 635 is a strong function of VCONTROL 630. As VCONTROL 630 increases from a voltage just sufficient to forward bias the base-emitter junction of Q5 635 to a voltage just sufficient to saturate Q5 635, the current terminals of Q5 635 draw an increasing amount of current. The increased Q5 current (referred to as the adjustment current) may be accommodated, at least in part, by an increase in the R5 current (I5). An increase in I5 corresponds to a decrease in I4, which is the control current for Q1 631. The resulting decrease in ICOMP 582 produces a corresponding increase in IREG 584, which causes an increase in IQ 341. After Q5 saturates, additional increases in VCONTROL 630 do not produce substantial increases in IQ 341.

Although the invention is described herein with reference to specific embodiments, various modifications and changes can be made without departing from the scope of the present invention as set forth in the claims below. For example, although the self regulating biasing circuit is illustrated as being comprised entirely of bipolar transistors, other embodiments may employ MOS transistors. Similarly, although the depicted embodiment described a self regulated biasing circuit for a power amplified in an RF circuit, the self regulated control may be implemented in other types of circuits. As another example, although FIG. 6 depicts quiescent adjustment circuitry, other embodiments may not. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A power amplifier for use in an RF circuit, comprising:
a power transistor;
a self regulating biasing circuit operable to:
   couple to a power supply to receive a supply signal comprising a supply voltage having a nominal component and a variance component and a supply current having a nominal component and a variance component; and
   monitor a first node having a voltage indicative of the supply voltage, generate a detection current based on the monitored voltage, and generate a compensation current based on the detection current, wherein the compensation current is drawn from a control node that receives the supply current; and
a first resistor connected between the power supply and the first node.

2. The power amplifier of claim 1, further comprising a second resistor connected between the first node and the control node.

3. The power amplifier of claim 2, wherein said detection current is generated by a detection circuit connected between the first node and a third node, wherein the detection circuit includes a third resistor in series with current terminals of a detection transistor.

4. The power amplifier of claim 3, wherein the detection transistor is a bipolar transistor and wherein a base terminal of the detection transistor is connected to a collector terminal of the detection transistor.

5. The power amplifier of claim 4, wherein the detection circuit further includes a fourth resistor connected between the third node and a control terminal of a compensation transistor.

6. The power amplifier of claim 5, wherein current terminals of the compensation transistor are connected in series between the control node and ground.

7. The power amplifier of claim 1, wherein the self regulating biasing circuit is further operable to adjust the nominal component of the supply current for a selected nominal value of the supply voltage.

8. The power amplifier of claim 1, wherein the self regulating biasing circuit includes a quiescent adjustment circuit including an adjustment transistor having a control terminal operable to receive a control voltage and current terminals connected to draw an adjustment current wherein the adjustment current affects the detection current.

9. A self regulating biasing circuit, comprising:
an impedance element connected between a first node and a control node, wherein the impedance element is configured to carry an unregulated current comprising a nominal component and a variance component;
a detection circuit connected between the first node and a third node and operable to detect a voltage variance of the first node and to generate a detection current based on voltage variance; and
a compensation circuit connected to the third node and operable to generate a compensation current based on the detection current, wherein the compensation circuit is configured to draw the compensation current from the control node and wherein the compensation current is approximately equal to the variance component of the unregulated current;

wherein the impedance element comprises a first resistor, the detection circuit comprises a second resistor connected in series with current terminals of a detection transistor, and the compensation circuit comprises a compensation transistor and a third resistor connected between a control terminal of the compensation transistor and the third node, wherein current terminals of the compensation transistor are connected between the control node and ground.

10. The circuit of claim 9, wherein the compensation circuit is configured to receive a control voltage signal and to draw an adjustment current, wherein the adjustment current depends on the control voltage.

* * * * *